United States Patent
Yamamoto et al.

(10) Patent No.: US 7,129,507 B2
(45) Date of Patent: *Oct. 31, 2006

(54) CHIP MIS-POSITION DETECTION METHOD

(75) Inventors: Akira Yamamoto, Mitaka (JP);
Konosuke Murakami, Mitaka (JP);
Yoshio Niki, Mitaka (JP); Takashi Ishimoto, Mitaka (JP); Yutaka Ueda, Mitaka (JP)

(73) Assignee: Tokyo Seimitsu Co., Ltd, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/051,035

(22) Filed: Feb. 4, 2005

(65) Prior Publication Data

US 2005/0173702 A1    Aug. 11, 2005

(30) Foreign Application Priority Data

Feb. 9, 2004   (JP)   ................. 2004-031868

(51) Int. Cl.
*G01N 21/00*   (2006.01)

(52) U.S. Cl. ............ 250/559.29; 250/221; 250/559.12; 250/559.13; 250/559.37; 250/559.45

(58) Field of Classification Search ........... 250/559.12, 250/559.13, 559.29, 559.37, 221, 559.45; 324/754–762, 765–769; 29/709, 712, 407.04, 29/407.05; 438/33, 68, 113, 460–465; 348/126
See application file for complete search history.

(56) References Cited

U.S. PATENT DOCUMENTS

| | | | | |
|---|---|---|---|---|
| 5,444,386 A | * | 8/1995 | Mizumura | ................. 324/754 |
| 6,085,407 A | * | 7/2000 | Gamel et al. | ................. 29/712 |
| 6,218,849 B1 | * | 4/2001 | Kiyokawa | .................... 324/755 |
| 6,461,938 B1 | * | 10/2002 | Nakabayashi | ................ 438/458 |
| 6,558,975 B1 | * | 5/2003 | Sugino et al. | ................. 438/64 |
| 6,800,840 B1 | * | 10/2004 | Nakano et al. | ............. 250/221 |
| 6,906,542 B1 | * | 6/2005 | Sakagawa et al. | .......... 324/754 |
| 6,919,262 B1 | * | 7/2005 | Senoo et al. | ................. 438/464 |
| 6,998,629 B1 | * | 2/2006 | Fan | ........................ 250/559.29 |
| 2002/0026931 A1 | * | 3/2002 | Kurosawa et al. | ............. 125/35 |
| 2004/0038498 A1 | * | 2/2004 | Ozono et al. | ................. 438/464 |
| 2005/0003635 A1 | * | 1/2005 | Takekoshi | .................... 438/464 |
| 2005/0003636 A1 | * | 1/2005 | Takyu et al. | ................. 438/464 |
| 2005/0070074 A1 | * | 3/2005 | Priewasser | .................... 438/462 |
| 2005/0156321 A1 | * | 7/2005 | Misumi et al. | ............. 257/777 |
| 2006/0005911 A1 | * | 1/2006 | Kubo et al. | .................... 156/84 |

* cited by examiner

*Primary Examiner*—Stephone B. Allen
*Assistant Examiner*—Davienne Monbleau
(74) *Attorney, Agent, or Firm*—Christie, Parker & Hale, LLP

(57) ABSTRACT

The invention is a method for detecting float or peel of semiconductor chips arranged in X and Y axes directions diced and bonded to a dicing tape on a stage. The method includes detecting float or peel of the semiconductor chips in a respective horizontal or longitudinal row arranged in the X or Y axis direction; moving the stage in the X axis direction, the Y axis direction, a Z axis direction, and a rotational direction around the Z axis for aligning the stage with a position detection unit for detecting positions of the semiconductor chips in the X axis direction and the Y axis direction; detecting the positions of abnormal semiconductor chips in the respective horizontal or longitudinal row that includes said abnormal semiconductor chips; and specifying the positions of said abnormal semiconductor chips on the X-Y axes.

4 Claims, 3 Drawing Sheets

CHIP MIS-POSITION DETECTION METHOD

CROSS-REFERENCE TO RELATED APPLICATION

This application claims priority of Japanese Patent Application Number 2004-031868, filed on Feb. 9, 2004.

BACKGROUND OF THE INVENTION

1. Field of the Invention

This invention relates to a chip mis-position detection method for detecting a mis-position of a semiconductor chip on a dicing tape when an electrical characteristic inspection, of the semiconductor chips fixed to the dicing tape, is carried out.

2. Description of the Related Art

A large number of semiconductor devices (chips), forming the same electrical chip circuits, are formed on a surface of a wafer, and an approval/rejection judgment is made by using a prober to inspect electrical characteristics of each electrical chip circuit before the wafer is diced into discrete semiconductor devices (semiconductor chips). The prober generally has a construction in which a probe card having a probe corresponding to each semiconductor device of the wafer and connected to a tester is allowed to serially correspond to each semiconductor chip, brings its probes into contact with electrode pads of the semiconductor device and conducts electric measurement.

To reduce size, weight and thickness of electronic appliances such as cellular telephone units, digital cameras and mobile information terminals, a packaging technology for semiconductor integrated circuitry has now reached the stage of a chip size package (CSP) or a wafer level chip size package (WCSP). The CSP uses semiconductor chips arranged in a stack.

Therefore, a wafer having a reduced thickness of 100 μm or below has been required. In such thin wafers, the possibility of defect has become high during the process in which the wafer is diced into discrete semiconductor chips in a dicing step after the electrical characteristic test by using a prober. The demand is also high that the electrical characteristic test be conducted as much as possible in the last stage of the production of the semiconductor chips to reduce the percentage of defectives in the packaged products.

The electrical characteristic test of the semiconductor chips in the chip state has been made in the past by using a frame-carrying prober. In this case, to prevent the semiconductor chips diced during the dicing step from scattering, a dicing tape is bonded to a surface of the wafer on which the electronic chip circuits are not formed, and the wafer is then diced. The dicing tape has a round shape the same as the wafer and after the wafer is diced, the dicing tape is stretched in such a manner as to increase its diameter and is held under the stretched state by a ring-like metal frame. In other words, the discrete semiconductor chips diced are held as bonded to the dicing tape while the gaps (breaks) between the semiconductor chips are somewhat expanded. The semiconductor chips are carried under such a state by the frame and the electrical characteristic test of the discrete semiconductor chips is conducted while the semiconductor chips are held on the stage of the frame-carrying prober.

According to the prior art method described above, however, some semiconductor chips peel from the dicing tape from time to time. When the electrical characteristic test is started under this state, the semiconductor chips that are about to peel come into contact with probes of a probe card of the frame-carrying prober and breaks the probes and the chips. When alignment is conducted to position the semiconductor chips, the peeling semiconductor chips impinge against an alignment camera and break the alignment camera and the semiconductor chips.

SUMMARY OF THE INVENTION

In view of the problems described above, the invention provides a chip mis-position detection method that detects beforehand semiconductor chips peeling or floating from a dicing tape, and can prevent breakage of semiconductor chips, probe card probes, alignment camera, etc, by specifying the peel positions.

The mis-position detection method of chips according to the present invention includes first detection means disposed on the side of a frame-carrying prober, for detecting float peel of semiconductor chips inside a horizontal or longitudinal row unit regularly arranged in an X or Y axis direction and second detection means disposed above the stage of the frame-carrying prober, for detecting the positions of abnormal semiconductor chips in a horizontal or longitudinal unit row including the abnormal semiconductor chips float or peel of which is detected by the first detection means, and specifies the positions of the abnormal semiconductor chips, float or peel of which is detected, on the X-Y coordinate axes among a large number of semiconductor chips regulated arranged in the X and Y axes directions by using the first and second detection means while the stage is being moved in the X and Y axes directions. Therefore, the invention can detect in advance the semiconductor chips peeling or floating from the dicing tape, can thus specify their positions and can, in advance, remove such abnormal semiconductor chips, so that the invention can prevent breakage of the probe card probes, the alignment camera and the semiconductor chips resulting from the contact with the abnormal semiconductor chips.

In the chip mis-detection method according to the present invention, the first and second detection means utilize a laser beam.

A defective electrode pad detection method according to the present invention detects defective electrode pads in each semiconductor device set onto a prober by utilizing the mis-position detection method of chips described above, and can prevent the occurrence of defects such as bending of probes due to the defective electrode pads and breakage of a probe card.

The invention will become more apparent from the following description of embodiments thereof when taken in connection with the accompanying drawings.

DESCRIPTION OF THE PREFERRED EMBODIMENTS

Figure 1:
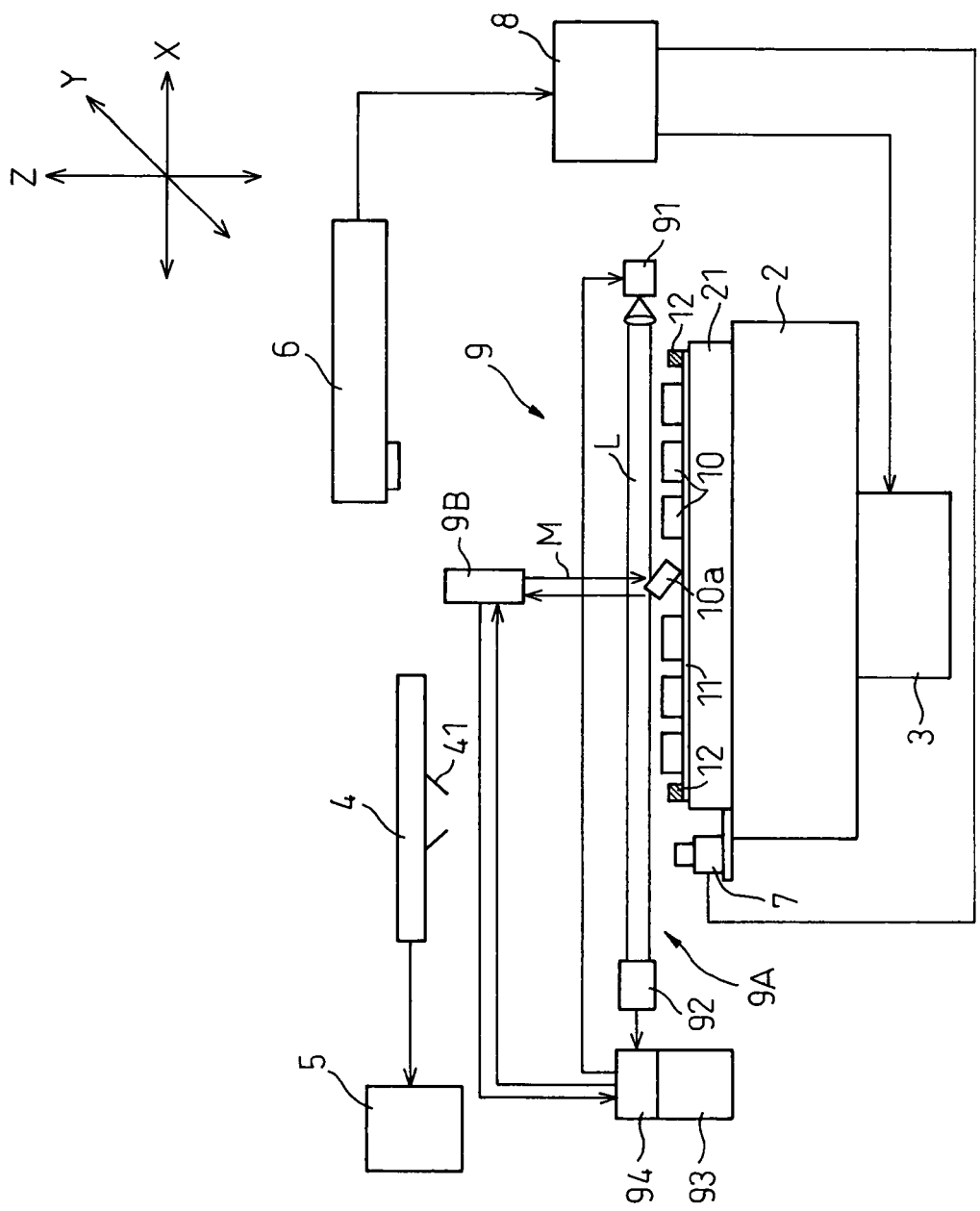
FIG. 1 schematically shows an overall construction of a frame-carrying prober to which a chip mis-position detection method of an embodiment of the invention is applied.
Figure 2:
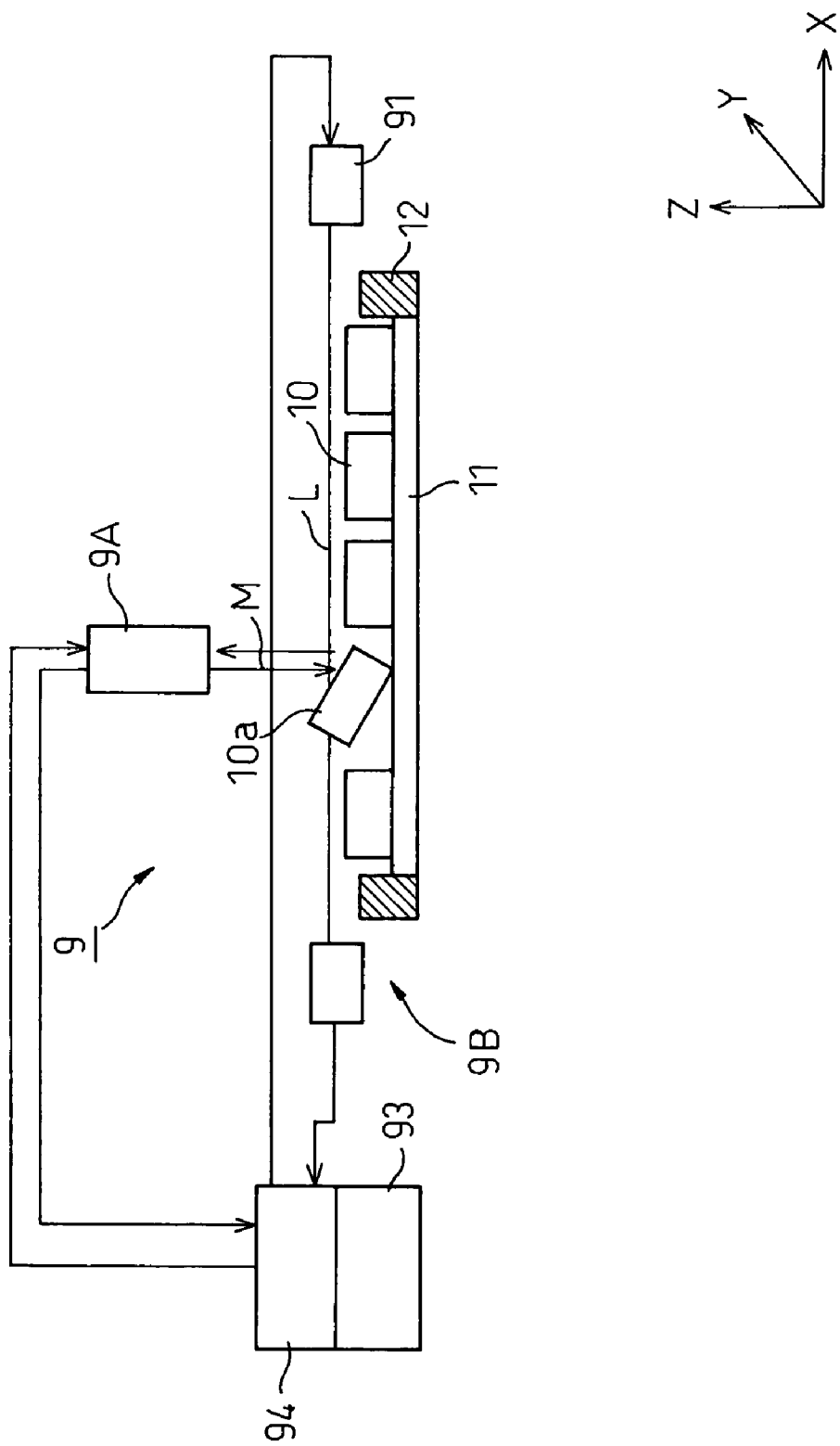
FIG. 2 is a side view useful for explaining the chip mis-position detection method of the invention.

A frame-carrying prober according to an embodiment of the invention will be hereinafter explained with reference to the accompanying drawings. An ordinary prober and a frame-carrying prober are different only in that the prober inspects electrical characteristics of semiconductor devices formed on a wafer whereas the frame-carrying prober inspects the electrical characteristics of semiconductor chips diced discretely from the wafer as described above, and they have a similar mechanism. FIG. 1 schematically shows an overall construction of the frame-carrying prober according to the invention. FIG. 2 explains mis-position detection means having first and second detection means as the feature of the invention.

The frame-carrying prober 1 include a stage 2, a stage driving motor 3, a probe card 4 equipped with probes 41, a tester 5, an alignment optical device 6, a CCD camera 7 on the stage side and a control portion 8 in the same way as the ordinary prober. The frame-carrying prober 1 further includes mis-position detection means having first and second detection means 9A and 9B.

Discrete semiconductor chips 10 diced from a wafer are held by a ring-like frame 12 while they are bonded onto a dicing tape 11 and are carried under this state. To form the semiconductor chips 10 under this state, the dicing tape 11 is bonded to the back of the wafer on which electrical chip circuits are not formed, and the wafer is then diced. When dicing is done in this way, the discrete semiconductor chips 10 are bonded to the dicing tape 11 as diced. Next, the dicing tape 11 is uniformly stretched in a radial direction and is held as stretched by the ring-like frame 12. The semiconductor chips 10 are carried under this state by the frame 12.

The semiconductor chips 10 are put on and held by a chuck portion 21 on the state together with the frame 12. The stage 2 is so constituted as to be capable of moving in X, Y and Z directions and in a θ rotating direction with the Z axis as the center by a stage driving motor 3 controlled by the control portion 8. The stage 2 can three-dimensionally move the semiconductor chips 10 held by the chuck portion 21 of the stage 2.

A large number of electrode pads (not shown in the drawings) are formed on the surface of the semiconductor chips 10 and the probe card 4 is provided with probes 41 corresponding to the electrode pads of the semiconductor chips 10. Therefore, the electrical characteristics of the semiconductor chips 10 can be inspected by bringing the probes 41 of the probe card 4 connected to the tester 5 into contact with the electrode pads of the semiconductor chips 10. Incidentally, when a plurality of semiconductor chips 10 is inspected at once, the probe card 4 has the same number of probes 41 as the number of the electrode pads.

The frame-carrying prober 1 according to the invention includes the alignment optical device 6 using an alignment camera for positioning the probes 41 of the probe card 4 with the electrode pads of the semiconductor chip 10 in the same way as the ordinary prober. In other words, the CCD camera 7 for imaging from below the probes 41 and detecting the distal end positions of the probes 41 is fitted to the stage 2. The CCD camera 7 is moved when the stage 2 is operated, measures the distal end position of each probe 41 while establishing its focus and inputs the measurement result to the control portion 8. The alignment optical device 6 recognizes the pattern of the semiconductor chips 10 and inputs the recognition result to the control portion 8. In this way, the control portion 8 can automatically conduct positioning between the distal end of each probe 41 and each electrode pad of the semiconductor chip 10 by using a known image processing technology on the basis of the information acquired by the alignment optical device 6 and the positional information of the distal end of each probe 41 acquired by the CCD camera 7 of the stage 2.

The frame-carrying prober 1 according to the invention further includes the mis-position detection means 9 having the first and second detection means 9A and 9B for detecting the semiconductor chips 10 peeling or floating from the dicing tape 11 as the feature of the invention. The first detection means 9A of the mis-position detection means 9 includes a light emission portion 91 for emitting a laser beam L, a light reception portion 92 for receiving the laser beam L from the light emission portion 91, a judgment portion 93 for judging peel or float of the semiconductor chips 10 from the laser beam L received by the light reception portion 92 depending on the increase/decrease of the light reception amount and an amplification portion 94. The laser beam L emitted from the light emission portion 91 is turned to parallel rays by a lens 95 and travels on the semiconductor chips 10 towards the light reception portion 92. When some of the semiconductor chips peel from the dicing tape 11 and partially float up, a part of the leaser beam L is cut off by these semiconductor chips 10a and does not reach the light reception portion 92. As the laser beam L is emitted above the semiconductor chips 10 and is gradually brought close to the upper surfaces of the semiconductor chips 10 by, for example, moving the stage 2 in the Z axis direction, the semiconductor chip or chips 10a peeling or floating from the dicing tape 11 in the horizontal row or the longitudinal low parallel to the X or Y axis can be detected from the increase/decrease of the light reception amount in the light reception portion 92.

Figure 3:
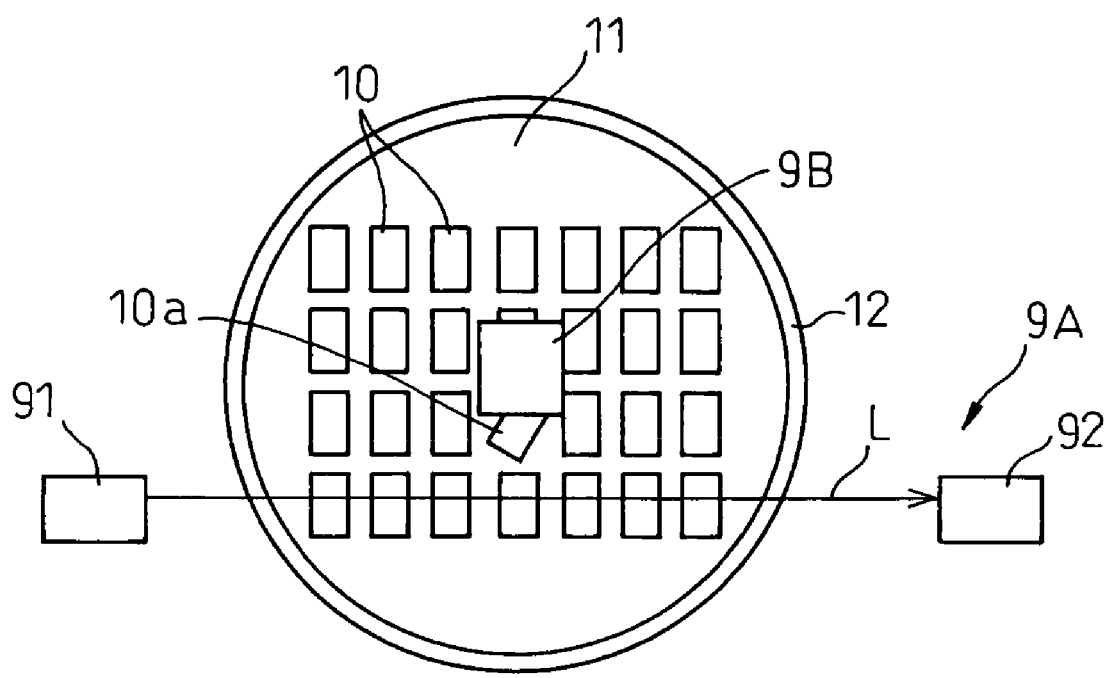
FIG. 3 is a plan view useful for explaining the chip mis-position detection method of the invention.

In this case, when the light emission portion 91 and the light reception portion 92 as the first detection means 9A are arranged in the X axis direction as shown in FIG. 3, peel or float of the semiconductor chips 10 inside the entire horizontal row parallel to the X axis can be detected by moving the stage 2 in the Y axis direction. Incidentally, when the light emission portion 91 and the light reception portion 92 as the first detection means 9A are arranged in the Y axis direction, peel or float of the semiconductor chips 10 inside the entire longitudinal row parallel to the Y axis can be detected by moving the stage 2 in the X axis direction. Even though peel or float of the semiconductor chips 10a inside the horizontal row or the longitudinal row can be detected by the first detection means 9A alone, however, it is not possible to specify the semiconductor chip or chips 10a of which of the horizontal and longitudinal rows peel or float. In other words, it is not possible to correctly detect the existence of peel or float of the discrete semiconductor chips 10 on the X-Y coordinate axes.

Therefore, the invention includes the second detection means 9B as the mis-position detection means 9. This second detection means 9B is arranged above the stage 2 and includes a light emission portion (not shown) for emitting the laser beam M and a light reception portion (not shown) for receiving the reflected laser beam M and is connected to a judgment portion 93 for judging peel or float from the concavo-convex condition of the semiconductor chips 10 and to an amplification portion 94. The first detection means 9A judges peel or float of the semiconductor chips 10 by the increase/decrease of the light reception amount of the laser beam L but the second detection means 9B judges peel or float of the semiconductor chips 10 from their concavo-convex condition due to the change with time from light emission to light reception.

In other words, when the first detection means 9A judges that peel or float of the semiconductor chip(s) 10a exists in a specific horizontal row parallel to the X axis, for example, the stage 2 is moved in the Y axis direction in such a fashion that this specific horizontal row is situated just below the second detection means 9B. The stage 2 is moved in the X axis direction under this condition and the position of the semiconductor chip 10a in the specific horizontal row that peels or floats is specified.

When the first detection means 9A is arranged in the Y axis direction and peel or float of the semiconductor chip 10a is detected in a specific longitudinal direction parallel to the Y axis, too, the position of the semiconductor chip 10a in the specific longitudinal row that peels or floats can be specified by the same method as described above.

The invention can thus specify the position of the semiconductor chip 10a, that peels or floats, on the X-Y coordinates by using the first detection means 9A and the second detection means 9B as the peel detection means 9.

The semiconductor chip 10a which is judged as defective by the judgment portion 93 and the position of which is specified is removed either manually or automatically. Alternatively, the electrical characteristic test is carried out in such a fashion as to avoid the defective semiconductor chips 10a. In this way, contact of the peeling or floating semiconductor chip with the probe card probe or with the alignment camera can be avoided and their breakage can be prevented.

The invention is suitable particularly when a space for installing the detection means is available in only one of the X and Y axes directions or on only one of the sides but a space for installing the detection means above the stage is available.

The embodiment described above uses the laser beams L and M and detects peel or jump-out of the semiconductor chips 10 from the dicing tape 11 but may use ultrasonic wave in place of the laser beams L and M. Quite naturally, a transmission portion of the ultrasonic wave and a reception portion of the ultrasonic wave are used in this case in place of the light emission portion 91 of the laser beam and the light reception portion of the laser beam, respectively.

The embodiment described above detects the semiconductor chips 10 peeling or floating from the dicing tape 11 but can also detect defective electrode pads among those formed on each semiconductor device of the wafer set onto the probe by utilizing the same principle. In other words, the electrode pads such as bump pads are formed on the semiconductor device but some electrode pads are formed, in some cases, to a height greater than that of the normal electrode pads. When the probes of the probe card come into contact with such defective electrode pads, abnormal force acts on the probes, so that the probes are bent or broken and this results in breakage of the probe card. It is therefore necessary to determine in advance the coordinate positions of the defective electrode pads, to avoid probing and to prevent breakage of the probe card. The positions of the defective electrode pads on the wafer can be detected by using the first and second detection means according to the invention.

Although the invention has thus been described about the specific embodiments thereof, it will be obvious to those skilled in the art that numerous changes or modifications can be made thereto without departing from the scope of claim and concept of the invention.

What is claimed is:

1. A mis-position detection method for detecting float or peel of semiconductor chips arranged in X and Y axes directions diced and bonded to a dicing tape on a stage, said method comprising:
   detecting float or peel of said semiconductor chips in a horizontal or longitudinal row arranged in the X or Y axis direction respectively;
   moving the stage in the X axis direction, the Y axis direction, a Z axis direction, and a rotational direction around the Z axis for aligning the stage with a position detection unit for detecting positions of the semiconductor chips in the X axis direction and the Y axis direction;
   detecting the positions of abnormal semiconductor chips in the respective horizontal or longitudinal row that includes said abnormal semiconductor chips; and
   specifying the positions of said abnormal semiconductor chips on the X-Y axes while said stage is being moved in the X and Y axes directions.

2. A mis-position detection method as defined in claim 1, wherein said detecting float or peel of said semiconductor chips is performed by using a laser beam.

3. A mis-position detection method as defined in claim 2, further comprising detecting defective electrode pads of a semiconductor device.

4. A mis-position detection method as defined in claim 1, further comprising detecting defective electrode pads of a semiconductor device.

* * * * *